United States Patent
Alam et al.

(10) Patent No.: US 7,723,207 B2
(45) Date of Patent: May 25, 2010

(54) THREE DIMENSIONAL INTEGRATED CIRCUIT AND METHOD OF DESIGN

(75) Inventors: Syed M. Alam, Cambridge, MA (US); Ibrahim M. Elfadel, Ossining, NY (US); Kathryn W Guarini, Yorktown Heights, NY (US); Meikei Ieong, Wappingers Falls, NY (US); Prabhakar N. Kudva, New York, NY (US); David S. Kung, Chappaqua, NY (US); Mark A. Lavin, Katonah, NY (US); Arifur Rahman, Freemont, CA (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 11/737,598

(22) Filed: Apr. 19, 2007

(65) Prior Publication Data

US 2007/0287224 A1    Dec. 13, 2007

Related U.S. Application Data

(62) Division of application No. 10/919,121, filed on Aug. 16, 2004, now Pat. No. 7,312,487.

(51) Int. Cl.
*H01L 21/30* (2006.01)

(52) U.S. Cl. .................. 438/455; 438/183; 257/419
(58) Field of Classification Search .............. 438/183, 438/455; 29/593; 257/419
See application file for complete search history.

(56) References Cited

U.S. PATENT DOCUMENTS

| | | | |
|---|---|---|---|
| 3,623,219 A * | 11/1971 | Stoller et al. | ................. 438/404 |
| 4,442,507 A | 4/1984 | Roesner | |
| 4,612,083 A | 9/1986 | Yasumoto et al. | |
| 5,189,505 A * | 2/1993 | Bartelink | ..................... 257/419 |
| 5,341,345 A | 8/1994 | Warner et al. | |
| 5,368,942 A | 11/1994 | Smith et al. | |
| 5,915,167 A | 6/1999 | Leedy | |
| 6,093,623 A | 7/2000 | Forbes | |
| 6,590,423 B1 | 7/2003 | Wong | |
| 6,600,173 B2 | 7/2003 | Tiwari | |
| 6,639,821 B2 | 10/2003 | Battersby | |
| 6,846,703 B2 | 1/2005 | Shimdoa et al. | |
| 6,983,443 B2 | 1/2006 | Korzyniowski et al. | |
| 2002/0179957 A1 | 12/2002 | Traylor et al. | |
| 2003/0020090 A1 | 1/2003 | Heck et al. | |
| 2004/0017242 A1 | 1/2004 | Lee | |
| 2004/0261043 A1 * | 12/2004 | Baumgartner et al. | .......... 716/4 |
| 2005/0044514 A1 * | 2/2005 | Wu et al. | ....................... 716/5 |

OTHER PUBLICATIONS

Kunio et al., Three Dimensional ICs, Having Four Stacked Active Layers, IEDM 89-837, Jul. 1, 1989, pp. 34.6.1-4, Publisher: IEEE, Published in: US.

Kioi et al. (Design and Implementation of a 3D-LSI Image Sensing Processor, IEEE Journal of Solid-State Circuits vol. 27, No. 8, Aug. 1992, pp. 1130-1140).

* cited by examiner

*Primary Examiner*—Thanh V Pham
*Assistant Examiner*—Caleb Henry
(74) *Attorney, Agent, or Firm*—Law Office of Charles W. Peterson, Jr.; Brian P. Verminski, Esq.

(57) ABSTRACT

A three dimensional (3D) integrated circuit (IC), 3D IC chip and method of fabricating a 3D IC chip. The chip includes multiple layers of circuits, e.g., silicon insulator (SOI) CMOS IC layers, each including circuit elements. The layers may be formed in parallel and one layer attached to another to form a laminated 3D chip.

13 Claims, 4 Drawing Sheets

THREE DIMENSIONAL INTEGRATED CIRCUIT AND METHOD OF DESIGN

CROSS REFERENCE TO RELATED APPLICATIONS

The present application is a divisional application of allowed U.S. patent application Ser. No. 10/919,121, now U.S. Pat. No. 7,312,487, "THREE DIMENSIONAL INTEGRATED CIRCUIT AND METHOD OF DESIGN" to Syed M. Alam et al., filed Aug. 16, 2004, issued Dec. 25, 2007, assigned to the assignee of the present invention and incorporated herein by reference.

BACKGROUND OF THE INVENTION

1. Field of the Invention

The present invention is related to integrated circuit (IC) design and, more particularly, to designing and fabricating ICs in three dimensions (3D).

2. Background Description

Semiconductor technology and chip manufacturing advances have resulted in a steady decrease of chip feature size to increase on-chip circuit switching frequency (circuit performance) and the number of transistors (circuit density). Generally, all other factors being constant, the active power consumed by a given unit increases linearly with switching frequency. Thus, notwithstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most integrated circuits (ICs) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. A CMOS inverter, for example, is a PFET and NFET pair that are series connected between a power supply voltage ($V_{dd}$) and ground (GND). Both are gated by the same input and both drive the same output, typically a capacitive load and, ideally, a typical CMOS circuit consumes only transient or switching power.

The typical approach to improving density (more FETs per unit area) has been to shrink minimum design dimensions. However, this approach is always limited by those minimum dimensions. For added density chips can be stacked to double, triple and etc. device density in what may be termed a three dimensional (3D) chip. However, simply stacking chips requires maintaining the normal chip circuit boundaries. So, signals passing between chip boundaries still suffer the penalties attributed to inter-chip communications. By contrast, in what may be termed a rudimentary top down approach, layers of FETs, e.g., alternating layers of PFETs and NFETs, are formed individually and bonded on top of one another to form a 3D IC chip. For example, Kunio et al., entitled "Three Dimensional ICs, Having Four Stacked Active Device Layers," IEEE, 1989, describes forming such a top down CMOS chip with polysilicon interconnects connecting the FETs on adjacent layers into circuits. In this example, a CMOS static random access memory (SRAM), programmable logic array (PLA), and CMOS gate array for I/O buffers are included on the same 3D IC chip. Polysilicon has inherent resistance that may be ignored for short distances, e.g., cross coupling SRAM cell inverters, but adds delay when driving a load of any significance (i.e., the polysilicon connection resistance from a driver driving a large capacitive load combines to add an RC delay to the path) and long polysilicon wire runs act as a distributed RC which also adds a distributed delay.

In state of the art top down 3D chips, however, individual circuits/macros are assembled or placed on one or more various circuit layers. Each of the circuit layers may include local wiring to wire devices together into circuits (e.g., AND, OR, NAND, NOR gates) and, in some cases, to wire circuits together into higher order functions (e.g., an n bit by n bit multiplier) or macros. The circuit layers are joined to form a single multilayered 3D chip. However, if the circuit layers are improperly or imprecisely aligned, chip functions may fail. Further, wiring on one layer can interfere electrically with wiring on another, e.g., through cross talk or because a signal cannot be routed between layers. So, typically, strict wiring constraints are necessary to avoid wiring problems and to adequately allocate wiring resources between the circuit layers. Furthermore, structures and systems must, of necessity, optimize wiring resources. Optimal logic and memory structure partitioning and placement is not well understood for these types of top down layered chips. Further, as noted above, timing problems can arise during logic partitioning for stacked macros. So, it may be impossible after placement and partitioning to close on the design, e.g., from the point of view of timing, thermal issues and/or noise. Finally, designing random logic in multiple layers can be very expensive, requiring special tools and much more complex simulations.

In what is sometimes termed a bottom up approach, after the design for one layer of circuits is completed with macro/layer inputs and outputs (I/Os) set, the design for the next layer begins. So, for example, circuits are fabricated conventionally on the lowest layer, e.g., on bulk silicon substrate or a silicon surface layer of a silicon on insulator (SOI) wafer. Then, a second circuit layer is formed (e.g., epitaxial silicon (epi Si) growth, recrystallization of amorphous silicon, or wafer bonding) on the base wafer and device processing is completed on that second layer. Thereafter, the sequence may be repeated to create additional superstructure circuit layers. Generally, once place and wire is complete for a circuit layer subsequent design considerations (e.g., selectively powering up logic gates as a result of timing analysis), the layer may, necessarily, be re-placed and re-wired if insufficient space remains, e.g., for powering up buffers. Furthermore, FETs formed in upper layers of bottom up 3D chips are of poor quality and degrade circuit performance. In addition, because forming the upper layers thermally cycles previously formed lower layers, sequentially forming subsequent circuit layers also degrades characteristics of the bottom, base circuit layer. For example, thermal cycling can cause dopant to diffuse from a well defined source/drain into adjacent channel regions, which degrades performance even for those circuits that do not include devices in layers other than the base circuit layer. As a result, material choices are limited for bottom up designs and, although very high density chips may be formed, FET quality is incompatible with high performance.

Thus, there is a need for very dense high performance integrated circuits and a method of designing such circuits such that circuit function may be distributed amongst a number of circuit layers without adversely impacting circuit performance.

SUMMARY OF THE INVENTION

It is a purpose of the invention to improve integrated circuit (IC) chip density;

It is another purpose of the invention to simplify IC design;

It is yet another purpose of the invention to increase IC chip functionality;

It is yet another purpose of the invention to increase IC chip functionality and improve IC chip density without complicating IC chip design and without impairing chip performance.

The present invention relates to a three dimensional (3D) integrated circuit (IC), 3D IC chip and method of fabricating a 3D IC chip. The chip includes multiple layers of circuits, e.g., silicon insulator (SOI) CMOS IC layers, each including circuit elements. The layers may be formed in parallel and one layer attached to another to form a laminated 3D chip. The present invention also relates to a 3D chip design methodology that makes optimal use of the presence of more than one layer of active devices.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
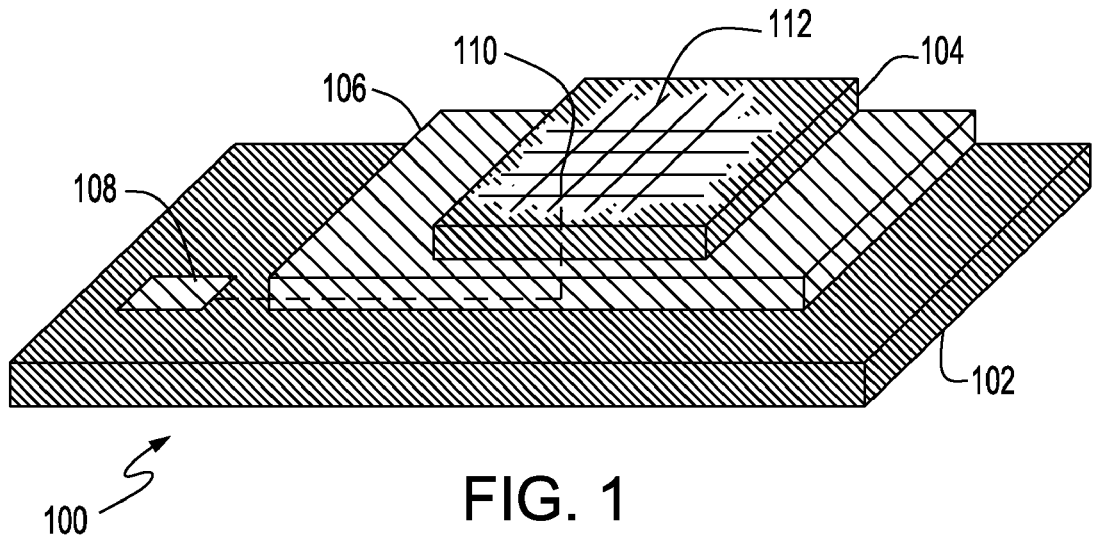
FIG. 1 shows an example of a preferred embodiment three dimensional (3D) integrated circuit (IC) chip formed according to the present invention.

Turning now to the drawings and, more particularly, FIG. 1 shows an example of a preferred embodiment three dimensional (3D) integrated circuit (IC) chip 100 formed according to the present invention. In this example, a first layer of circuits 102 supports a second layer of circuits 104, e.g., where the first layer 102 is a synchronous logic or pipeline layer and the second layer 104 includes a clock distribution (clock tree) for the first layer 102. It should be noted that as referred to herein a layer of circuits is a device structure or circuit wherein complete individual active and/or passive devices are contained and, further, may be wired together. Thus, circuits in a layer of circuits may include capacitors, such as decoupling capacitors, inductors, resistors and etc. In this example, the layers of circuits 102, 104 are connected together by an optional third layer of circuits 106 sandwiched therebetween, which is a layer of wires in this example. Circuit elements 108, e.g., a field effect transistor (FET), logic gate, macro or any suitable circuit element or electrical device, on the first layer 102 connect through the wiring layer 106 to circuit elements 110 in the second layer of circuits 104, which may be an array of circuit elements, e.g. a driver in a driver grid 112. Although each succeeding layer 106, 104 shown in this example is smaller (less surface area) than its underlying layer 102, 106, this is for example only. Typically, all layers 102, 106, 104 are coextensive covering the same area and forming a chip 100 with a uniform thickness. Furthermore, although the 3D IC chip 100 of this example includes 3 layers of circuits 102, 104, 106 this is selected by design and for example only. Any suitable number of layers of circuits may be selected.

Figure 2A:
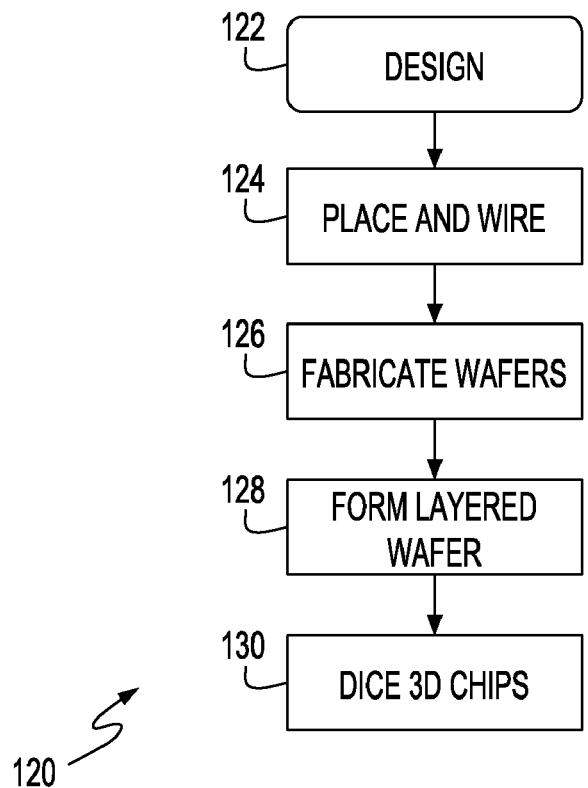
FIGS. 2A-B show an example of steps in forming preferred embodiment 3D chips.

FIG. 2A shows an example 120 of steps in forming a chip, e.g., chip 100, according to a preferred embodiment of the present invention. A logic or circuit design is provided in step 122 and placed and wired in step 124. In particular, during place and wiring step 124, the design may be partitioned to selectively place some functions on one circuit layer or to distribute devices, logic gates, etc. amongst the circuit layers. In step 126 the layer wafers are fabricated in parallel, e.g., with each layer of circuits being on an individual wafer or wafers in a wafer lot. In step 128 the layers of circuits are combined to form a single multilayered 3D circuit, e.g., the layered wafers are laminated together to form a single 3D wafer. The laminated 3D wafer is diced normally in step 130 to separate individual preferred embodiment 3D chips.

Figure 2B:
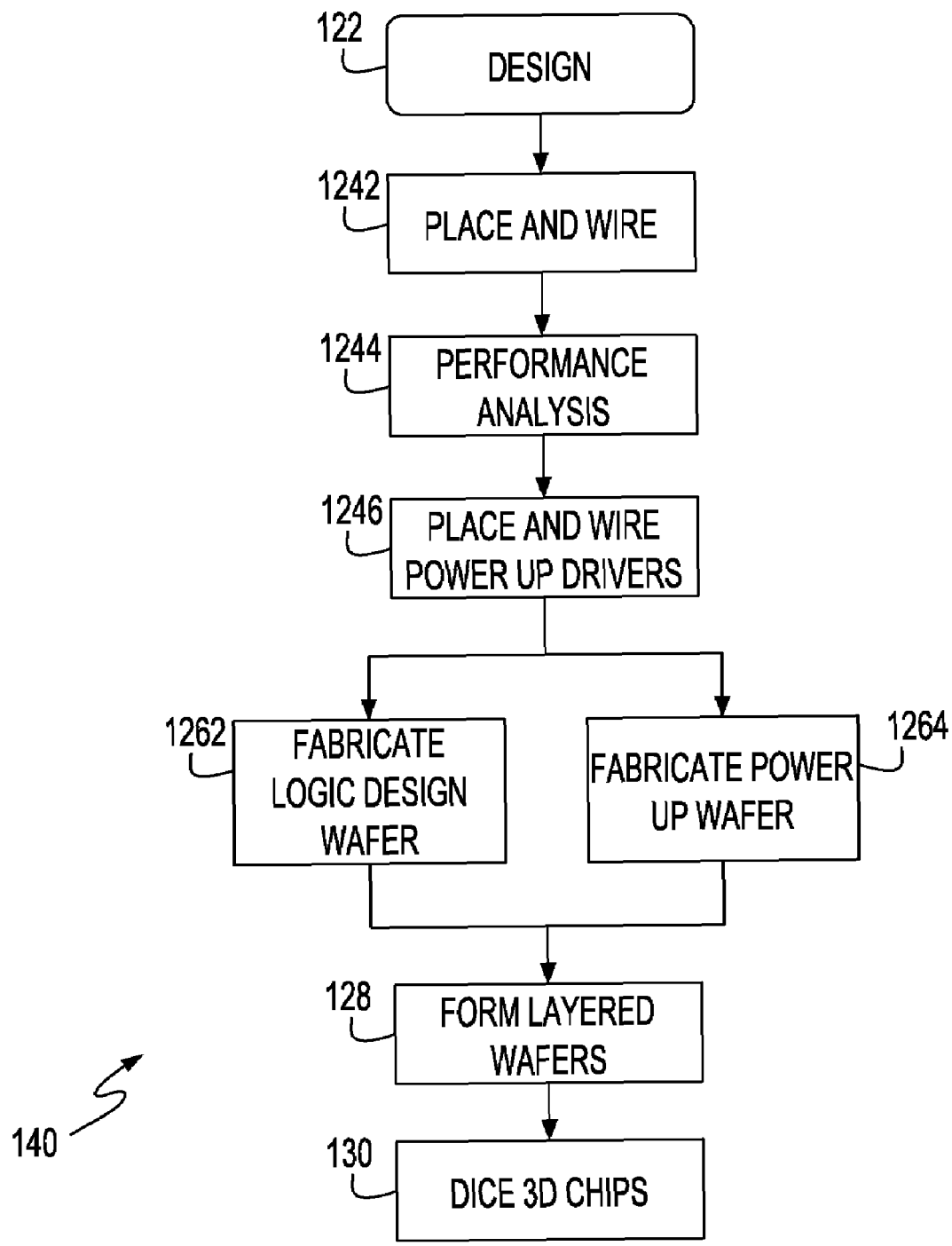

FIG. 2B shows an example 140 of a two (2) circuit layer variation of the example of FIG. 1 with like steps labeled identically. Again in step 122 an initial design, e.g., a logic design for a standard cell logic library, is provided and initially placed and wired in step 1242, preferably, on a single circuit layer. Buffers may be selectively omitted for placement on a subsequent circuit level. The boundaries between the logic and the omitted buffers are considered for the logic placement. Then in this example, the logic (minus buffers) are placed and wired on a single circuit layer. The single circuit layer design is passed for performance analysis in step 1244, e.g., using typical state of the art performance analysis tools. The performance analysis typically identifies logic elements on the first circuit layer that must be powered up or placed close together, e.g., placing a first cell driving (a source) a buffer or an input of a second (a sink) to meet performance requirements. Buffers may be placed with the logic on the first layer if space is available. Otherwise, in step 1246, buffers, power up drivers and etc., are placed on the second layer of circuits. Since buffers and power up drivers are placed on a second layer, buffers and drivers are easily placed close to the circuit it is buffering or powering up, even when no space is available in the vicinity of the particular first layer circuit. Also, optionally, late changes (such as what are known as engineering changes or ECs) to the design of the first layer may be made through the second layer. So, where previously space might not normally be available after the first layer placement, sufficient space is available on a preferred embodiment design at a corresponding overlying location in the second layer, e.g., placed as a stand alone logic element or selected from one or more cells in an array of cells or a driver array.

Once performance analysis is complete in step 1244 and additional logic has been placed and wired on the second circuit layer in step 1246; in steps 1262 and 1264, the layers of circuits are formed on wafers, preferably in parallel, e.g., with each layer being on an individual SOI wafer or wafers in a SOI wafer lot. Typically, the SOI wafers are formed conventionally to final or back end metallization. Step 128 begins, for example, by attaching each of the second layer wafers to a glass handle wafer using polymeric adhesives. Then, the second layer wafers may be thinned, e.g., by grinding and etching the wafer substrate and stopping on the buried oxide (BOX) layer. Each second layer wafer, which is transparent due to the thinning, is aligned and fixed, e.g., glued, to a first circuit layer wafer. Since the second layer wafer is transparent, all layers of circuits may be designed for a particular 3D IC chip with the same, common orientation on the original base substrates (all "face up"), to facilitate straightforward stacking layers of circuits. Thus, each subsequent layer wafer may be aligned to the immediately preceding layer wafer using overlay registration in a manner similar to mask-to-wafer alignment in photolithography. This alignment assures the electrical integrity of the pre-fabricated 3D circuits to facilitate successful high performance 3D ICs. Once attached, connections are formed between the laminated layers, e.g., etching inter-layer through-holes and metalizing to form vias in the through-holes. Finally, the laminated wafer stack is diced normally in step 130 to separate individual preferred embodiment 3D chips and with thermal and mechanical stresses minimized.

For larger designs, where the original design does not fit within a single chip footprint, in step 1242 the logic is partitioned between the first and second layers of circuits such that a majority of the circuit elements are in the first layer, e.g., 102 in FIG. 1. Then in step 1244 traditional physical synthesis optimizes both layers of circuits of the design for closure. During this performance analysis step 1244 additional circuit elements are identified and, if space is available, placed on the first layer wafer at the appropriate location; otherwise, if sufficient space is unavailable on the first layer of circuits or, if the additional elements cannot be placed without incurring an unacceptable performance penalty, the circuit elements are placed on the second layer of circuits, preferably such that the locations on both layers align, e.g., with an added sink immediately above the source. As noted above, the added element may be selected from elements of an existing regular array on the second layer or, a new circuit element may be created on the second layer.

Figure 3A:
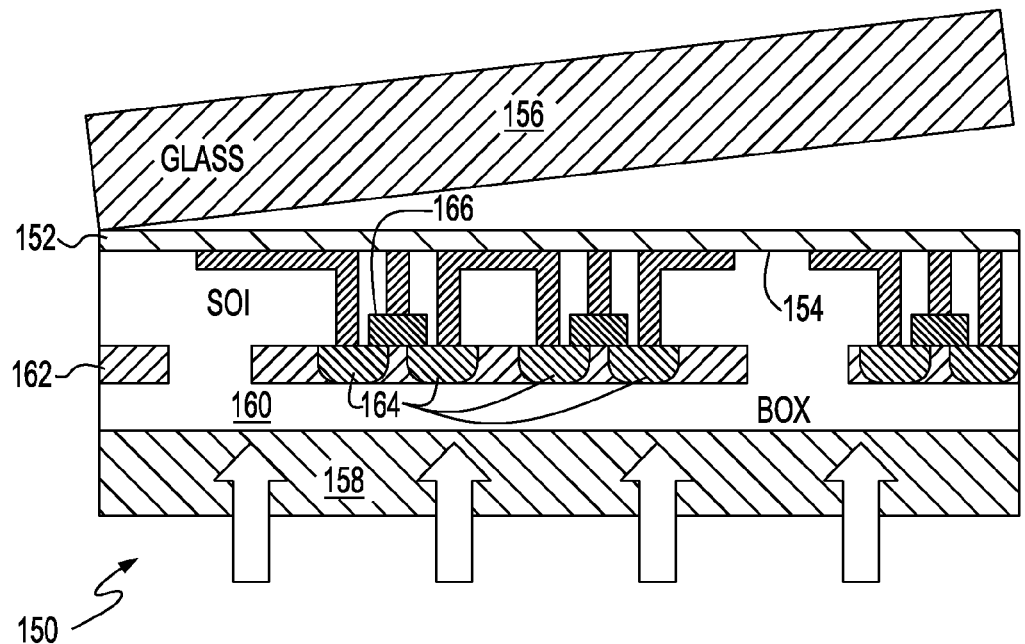
FIGS. 3A-C show an example of the step of attaching wafers in FIGS. 2A-B.
Figure 3B:
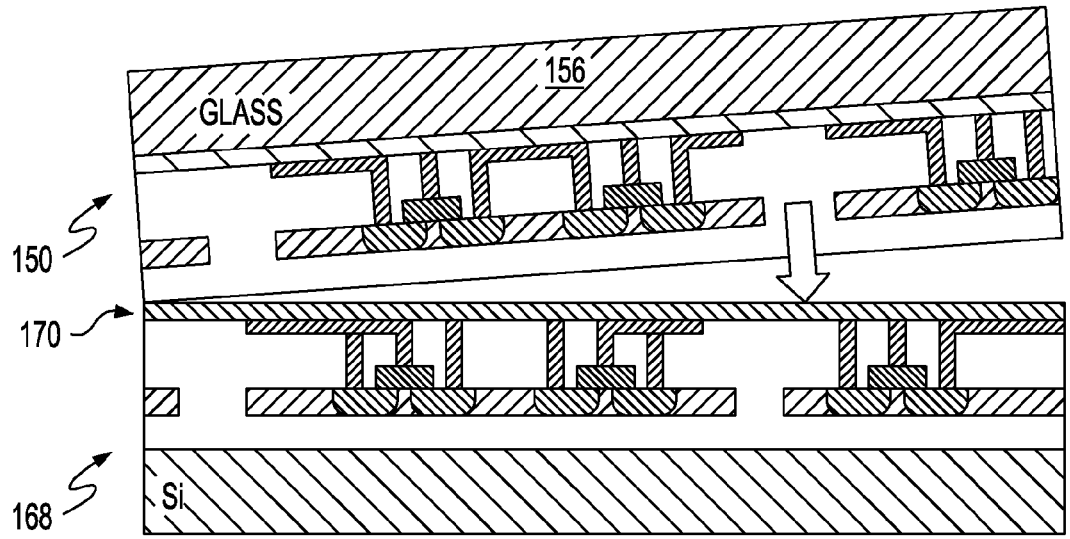
Figure 3C:
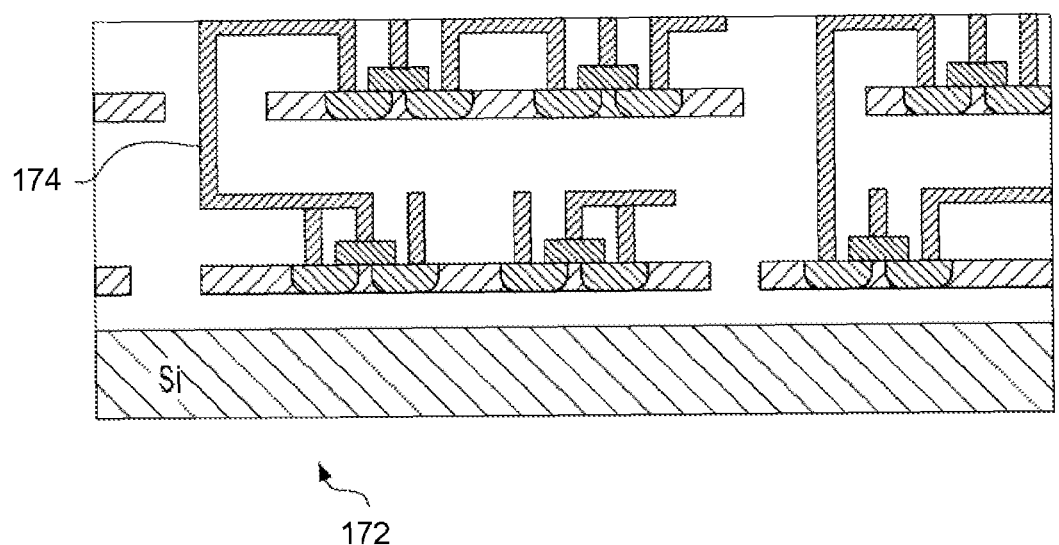

FIGS. 3A-C show an example of the step 128 of attaching wafers in FIGS. 2A-B. FIG. 3A shows the completed second layer wafer 150, e.g., a 200 millimeter (200 mm) SOI wafer with a bonding layer 152 on an upper surface 154 for attaching the glass handle wafer 156. The glass handle wafer 156 gives structural stability to the layer of circuits allowing removal of the original substrate. As with a typical SOI wafer, a substrate layer 158, e.g., silicon, supports an insulator layer 160, e.g., a BOX layer. A silicon device layer 162 has been divided to form device islands with source/drain regions 164 formed in the islands and gates 166 between the source/drain regions. The bonding layer 152 may be any suitable material for attaching the glass handle layer 156 to the wafer such that it remains attached as the substrate layer 158 is removed. The substrate layer 158 is removed by grinding and etching the wafer substrate layer 158 and stopping on the BOX layer 160. In particular, the thickness of the second layer is less than 50 micrometers (μm) or microns and more particularly, less than 15 μm. Then in FIG. 3B, after attaching the glass handle layer 156 and removing the substrate layer, the second layer wafer 150 is attached to a respective first layer wafer 168, e.g., using polymeric adhesives 170, bonding the layer wafers together. So, the first layer of circuits has been transferred from its original substrate layer 158 to the first layer of circuits 168 with the first layer of circuits 168 acting as a substrate for the second. In FIG. 3C the handle wafer 156 and bonding layer 152 are removed and the 3D circuit wafers 172 are completed vertical by forming interconnects 174 between conductive elements or wires between the laminated layers of circuits. In particular, both the connections on the layer wafers 150, 168 and the interconnections 174 there between may be copper, tungsten or, metalized studs and via.

Advantageously, in the preferred embodiment top-down approach, all of the layers of circuits can be fabricated simultaneously using conventional IC manufacturing techniques. Circuit elements on individual circuit layers combine to form higher level circuit elements, whether as adding power up buffers to otherwise underpowered logic circuits or as connecting I/O drivers to a macro, completing the macro I/O boundary. Each individual layer of circuits can be tested, e.g., at step 126 in FIG. 2A, prior to assembling the 3D IC. This facilitates acceptable chip yield and lowers manufacturing costs over putting off functional testing until the full 3D IC is complete. Transistor packing density is improved by a reduced chip footprint that is possible because of the third circuit dimension. This is particularly appealing for military and for wireless or portable electronics that place a premium on silicon real estate.

Additionally, circuit performance is enhanced for preferred embodiment 3D ICs because, instead of long wire runs between circuits, short vertical runs between layers of circuits reduce average interconnect length as compared to typical single layer chips. Wire length related performance latency, which may severely restrict performance as feature sizes are scaled down, is mitigated by the reduced electrical distance. This results in improved communication, e.g., between memory on one layer and a microprocessor on another, providing a significant performance gain for some applications. In particular, in synchronous chips with deep pipelines, the lengths of clock runs is dramatically reduced, e.g., by stacking clocked stages in a relatively small horizontal area, which increases the fraction of chip area accessible in a single clock cycle for a much greater logical span of control than would be possible with the same logic function spread out on a single layer of circuits. In addition, deep pipelines that perform speculative execution require high fan-out from a given data source. Since, fan-out for a typical FET circuit is limited to a fixed amount of capacitive gain per cycle, this limit is increased because extrinsic load (such as wiring) is reduced.

Furthermore, noise, such as cross talk from long runs (that are relatively large capacitive signal loads) of parallel signal or clock lines, as well as power is dramatically reduced by shorter wire lengths and die size. Similarly, noise immunity at each input gate is improved and fewer repeaters, e.g., for clocks, are necessary since there are fewer global wires that are much shorter than might be for the equivalent horizontal circuit function. In yet another advantage, mixing otherwise typically incompatible technologies provides a rich selection of single chip functions. Hybrid circuits are formed by stacking layers of circuits in a single preferred embodiment 3D chip, e.g., providing CMOS logic on one layer of circuits with one or more other layer that includes photonic/electronic circuits, memory, analog and/or radio frequency (RF) circuits. Thus, heterogeneous materials, devices, and signals can be integrated with SOI CMOS circuits without performance sapping off chip and/or off module connections and for much more flexibility in circuit and device structure, system design, and routing.

While the invention has been described in terms of preferred embodiments, those skilled in the art will recognize that the invention can be practiced with modification within the spirit and scope of the appended claims.

What is claimed is:

1. A method of fabricating an integrated circuit (IC) chip, said method comprising the steps of:
   a) providing an IC design;
   b) placing and wiring said IC design, circuit elements being placed on at least two circuit layers, selected said circuit elements of a first circuit layer of said at least two circuit layers being wired to corresponding circuit elements on a second circuit layer of said at least two circuit layers, power up circuits for circuits on said first circuit layer being placed on said second circuit layer;
   c) fabricating said at least two circuit layers;

d) attaching said second circuit layer to said first circuit layer; and
e) forming connection channels extending from circuit elements in said first circuit layer and in said second circuit layer, a three dimensional (3D) IC being formed by said circuit elements in said first circuit layer being connected to said circuit elements in said second circuit layer.

2. A method as in claim 1, wherein the step (b) of placing and wiring comprises the steps of:
   i) placing a majority of circuit elements in said first circuit layer; and
   ii) placing remaining circuit elements and said power up circuits on said second circuit layer.

3. A method as in claim 2, wherein the step (i) of placing a majority of elements comprises the steps of:
   A) initially placing and wiring logic in said IC design on a single layer;
   B) conducting performance analysis on the placed and wired said logic; and
   C) placing and wiring buffers on said second circuit layer, said buffers being power up circuits.

4. A method as in claim 3, wherein the step (C) of placing and wiring includes placing and wiring selected said circuit elements originally placed on said single layer.

5. A method as in claim 2, wherein said second circuit layer is an array of circuit elements and the step (ii) of placing said remaining circuit elements comprises selecting ones from said array.

6. A method as in claim 1, wherein the step (c) of fabricating said at least two layers comprises fabricating a first of said at least two on a first silicon on insulator (SOI) wafer and a second of said at least two on a second SOI wafer.

7. A method as in claim 6, wherein the step (d) of attaching comprises the steps of:
   i) attaching a glass handle wafer to said second SOI wafer;
   ii) removing a substrate layer from said second SOI wafer; and
   iii) attaching said second SOI wafer to said first SOI wafer, said first SOI wafer providing a substrate for said second SOI wafer.

8. A method as in claim 7, further comprising the step of:
   f) dicing stacked second SOI wafer and said first SOI wafer into individual three dimensional (3D) laminated chips.

9. A method of placing and wiring a circuit design, said method comprising the steps of:
   a) receiving an integrated circuit design;
   b) initially placing and wiring a majority of design circuit elements in a first circuit layer, buffers being placed on said first circuit layer after placing non-buffers;
   c) conducting performance analysis on the placed and wired said first circuit layer;
   d) selectively removing circuit elements placed on said first circuit layer including one or more said buffers;
   e) placing remaining circuit elements and removed said circuit elements on a second circuit layer; and
   f) wiring said second layer, elements on said second circuit layer being connected to corresponding elements on said first circuit layer.

10. A method as in claim 9, wherein said circuit elements remaining after the step (b) of initially placing and wiring are buffers for combinational logic on said first circuit layer.

11. A method as in claim 9, wherein the step (e) of placing said remaining circuit elements comprises selecting circuit elements from an array of circuit elements.

12. A method as in claim 11, wherein said array of circuit elements is an array of drivers.

13. A method of fabricating an integrated circuit (IC) chip, said method comprising:
   providing an IC design;
   placing and wiring said IC design comprising:
      initially placing and wiring logic in said IC design on a single layer,
      conducting performance analysis on the placed and wired said logic, and
      placing and wiring buffers on a second circuit layer, buffers on said second circuit layer being wired to corresponding circuit elements on said single circuit layer;
   fabricating the circuit layers;
   attaching said second circuit layer to said single circuit layer; and
   forming connection channels extending from circuit elements in said single circuit layer and in said second circuit layer, a three dimensional (3D) IC being formed by said circuit elements in said single circuit layer being connected to said buffers in said second circuit layer.

* * * * *